(12) United States Patent
Zhang et al.

(10) Patent No.: US 11,605,926 B2
(45) Date of Patent: Mar. 14, 2023

(54) CARD CONNECTOR, CARD HOLDER, AND TERMINAL DEVICE

(71) Applicant: Huawei Technologies Co., Ltd., Shenzhen (CN)

(72) Inventors: Shihao Zhang, Shanghai (CN); Gaobing Lei, Shenzhen (CN); Tien Chieh Su, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/285,185

(22) PCT Filed: May 9, 2019

(86) PCT No.: PCT/CN2019/086224
§ 371 (c)(1),
(2) Date: Apr. 14, 2021

(87) PCT Pub. No.: WO2020/077985
PCT Pub. Date: Apr. 23, 2020

(65) Prior Publication Data
US 2022/0029368 A1 Jan. 27, 2022

(30) Foreign Application Priority Data

Oct. 15, 2018 (CN) .......................... 201811199774.6

(51) Int. Cl.
*H01R 33/90* (2006.01)
*G06K 19/077* (2006.01)
(Continued)

(52) U.S. Cl.
CPC ....... *H01R 33/90* (2013.01); *G06K 19/07743* (2013.01); *H01R 33/765* (2013.01);
(Continued)

(58) Field of Classification Search
CPC ...... H01R 27/02; H01R 13/245; H01R 13/40; H01R 13/2442; G06K 7/0021; G06K 7/0052; H04B 1/3816
See application file for complete search history.

(56) References Cited

U.S. PATENT DOCUMENTS

2002/0065001 A1   5/2002  Sun
2004/0033722 A1   2/2004  Liu et al.
(Continued)

FOREIGN PATENT DOCUMENTS

CN          2708523 Y       7/2005
CN          2865071 Y       1/2007
(Continued)

*Primary Examiner* — Jean F Duverne
(74) *Attorney, Agent, or Firm* — Conley Rose, P.C.

(57) ABSTRACT

A card connector, a card holder, and a terminal device, where the card connector includes a plurality of first terminals and one or more second terminals. The first terminals are arranged to form a first card access area that installs a first card, and the first terminals are configured to be electrically coupled to the first card. The one or more second terminals are distributed on a periphery of the first card access area, the first terminals and the one or more second terminals form a second card access area that installs a second card, and the first terminals and the one or more second terminals are configured to be electrically coupled to the second card.

20 Claims, 14 Drawing Sheets

(51) Int. Cl.
  *H01R 33/76* (2006.01)
  *H05K 5/02* (2006.01)
  *H01R 12/71* (2011.01)
  *H01R 13/24* (2006.01)

(52) U.S. Cl.
  CPC ....... *H01R 33/7671* (2013.01); *H05K 5/0291* (2013.01); *H01R 12/714* (2013.01); *H01R 13/245* (2013.01)

(56) References Cited

U.S. PATENT DOCUMENTS

| | | | |
|---|---|---|---|
| 2013/0235532 A1* | 9/2013 | Chang | G06K 13/0831 361/725 |
| 2014/0030928 A1 | 1/2014 | Zhu et al. | |
| 2014/0055925 A1 | 2/2014 | Hsu et al. | |
| 2015/0207284 A1 | 7/2015 | Liu | |
| 2015/0380844 A1 | 12/2015 | Lee et al. | |
| 2016/0006173 A1 | 1/2016 | Wang et al. | |
| 2016/0226543 A1* | 8/2016 | Lu | H04B 1/3818 |
| 2018/0005090 A1 | 1/2018 | Hu et al. | |

FOREIGN PATENT DOCUMENTS

| | | |
|---|---|---|
| CN | 202196972 U | 4/2012 |
| CN | 202564594 U | 11/2012 |
| CN | 202797539 U | 3/2013 |
| CN | 203014103 U | 6/2013 |
| CN | 203326240 U | 12/2013 |
| CN | 203492067 U | 3/2014 |
| CN | 103811944 A | 5/2014 |
| CN | 203644998 U | 6/2014 |
| CN | 204012075 U | 12/2014 |
| CN | 104638485 A | 5/2015 |
| CN | 104795651 A | 7/2015 |
| CN | 106558779 A | 4/2017 |
| CN | 206135072 U | 4/2017 |
| CN | 106848652 A | 6/2017 |
| CN | 107465011 A | 12/2017 |
| CN | 107546509 A | 1/2018 |
| CN | 207304540 U | 5/2018 |
| CN | 108461946 A | 8/2018 |
| JP | 2002007972 A | 1/2002 |
| JP | 2010232097 A | 10/2010 |
| JP | 2016015307 A | 1/2016 |
| JP | 2017045678 A | 3/2017 |
| TW | 201330408 A | 7/2013 |
| TW | 201409844 A | 3/2014 |
| TW | M476377 U | 4/2014 |
| TW | 201533989 A | 9/2015 |
| WO | 2015127171 A1 | 8/2015 |
| WO | 2018053681 A1 | 3/2018 |

* cited by examiner

CARD CONNECTOR, CARD HOLDER, AND TERMINAL DEVICE

CROSS-REFERENCE TO RELATED APPLICATIONS

This application is a U.S. National Stage of International Patent Application No. PCT/CN2019/086224 filed on May 9, 2019, which claims priority to Chinese Patent Application No. 201811199774.6 filed on Oct. 15, 2018. Both of the aforementioned applications are hereby incorporated by reference in their entireties.

TECHNICAL FIELD

The present invention relates to the field of card connector technologies, and in particular, to a card connector applied to a card holder of a terminal device.

BACKGROUND

With develop ment of terminal device products, a plurality of cards need to be disposed in a terminal device to meet a functional requirement. A mobile phone is used as an example. Usually, a subscriber identity module (subscriber identification module, SIM for short) card, a data card (such as a nano memory card), and the like need to be disposed in the mobile phone. Each card requires a matching card connector. Therefore, card connectors in the terminal device need to occupy a larger plate area, and space inside the terminal is occupied. This severely restricts development of lightening and thinning of the terminal.

SUMMARY

A technical problem to be resolved in embodiments of the present invention is that a card connector occupies a relatively large plate area. Therefore, a card connector, a card holder, and a teminal device are provided, to reduce the plate area occupied by the card connector.

According to a first aspect, an embodiment of the present invention provides a card connector, including a plurality of first terminals and one or more second terminals. The plurality of first terminals are arranged to form a first card access area, the first card access area is used to install a first card, and the plurality of first terminals are configured to be electrically connected to the first card. The one or more second terminals are distributed on a periphery of the first card access area, the plurality of first terminals and the one or more second terminals jointly form a second card access area, the second card access area is used to install a second card, and the first terminals and the second terminals are all configured to be electrically connected to the second card. The card connector can be compatible with the first card and the second card, so as to reduce an occupied plate area, thereby saving more space.

In an implementation, the card connector further includes an insulation body, each first terminal includes a fixed end and an elastic end, the fixed end is fixedly connected to the insulation body, the elastic end elastically protrudes relative to a surface of the insulation body and is configured to abut against the first card or the second card, the fixed end is located on a front side or a rear side of the elastic end in a first direction, the one or more second terminals are located on a front side and/or a rear side of the first card access area in the first direction, and the first direction is perpendicular to an insertion direction of the first card or the second card. The plurality of first terminals and the at least one second terminal are disposed and isolated by using the insulation body, so that the first terminals and the second terminal can abut against chip pins of the first card or the second card.

In an implementation, there are two second terminals, and the two second terminals are distributed on two sides of the first card access area, so as to correspond to chip pins of the first card.

In an implementation, each second terminal includes a connection end and an abutting end, the connection end is fixedly connected to the insulation body, the abutting end elastically protrudes relative to the surface of the insulation body and is configured to abut against the second card, the first card access area is rectangular, and the two abutting ends are respectively located on peripheries of two adjacent corners of the first card access area. In this way, the card connector corresponds to a size and chip pins of the first card or the second card.

In an implementation, the second terminal extends in a long strip shape, and an extension direction of the second terminal is perpendicular to the first direction.

In an implementation, the card connector further includes an insulation body, each first terminal includes a fixed end and an elastic end, the fixed end is fixedly connected to the insulation body, the elastic end elastically protrudes relative to a surface of the insulation body and is configured to abut against the first card or the second card, the fixed end is located on a front side or a rear side of the elastic end in a second direction, the one or more second terminals and the first card access area are disposed side by side in the second direction, and the second direction is an insertion direction of the first card or the second card. The plurality of first terminals and the at least one second terminal are disposed and isolated by using the insulation body, so that the first terminals and the second terminal can abut against chip pins of the first card or the second card.

In an implementation, there are two second terminals, and the two second terminals are distributed on a same side of the first card access area. The elastic end of the second terminal can abut against a corresponding chip pin of the second card after the second card is installed.

In an implementation, the plurality of first terminals and the two second terminals all extend in a long strip shape, and extension directions are all the second direction.

According to a second aspect, an embodiment of the present invention provides a card holder, including a housing and the card connector, where accommodating space is disposed in the housing, and the card connector is fastened in the accommodating space.

In an implementation, there are two card connectors, the two card connectors are oppositely disposed, a slot is formed between the two card connectors, the first terminals and the second terminals of the two card connectors all elastically protrude toward the slot, and the first card and the second card can be installed in the slot at the same time, and are electrically connected to the two card connectors in a one-to-one correspondence. Because the first card and the second card are disposed in a cascading manner, an area occupied by the card holder is reduced to a relatively great extent. Therefore, space required for disposing the two cards may be reduced, and then an integration level of a terminal device is improved, so that more space is saved. Therefore, the terminal device can implement more functions.

In an implementation, tire card holder further includes a card tray, the card tray includes a bearing plate, both a front surface and a rear surface of the bearing plate are used to bear the first card and/or the second card, the bearing plate is disposed between the two card connectors in a cascading manner when the card tray is inserted into the slot, gaps are disposed on the bearing plate, arid the gaps are used to avoid the first terminals and the second terminals. The gaps may be used to prevent a fault such as a short circuit caused because the first terminals or the second terminals on the card connector elastically protrude and contact the bearing plate.

In an implementation, the bearing plate uses a metal material, in this way, the bearing plate is sufficiently rigid, and is not easy to crack or deform, so that the bearing plate can support the first card or the second card.

In an implementation, the card tray further includes an insulation frame and an elastic component that surround the hearing plate, the elastic component includes a fixed part and an elastic part, the fixed part is fastened to the card tray, the elastic part extends to the hearing plate, and the elastic part includes a metal dome and an insulator that is connected to the metal dome and that is configured to abut against the first card and/or the second card. Through cooperation of the elastic part and the fixed part, the first card and/or the second card may not easy to fall off. This facilitates installation.

In an implementation, the insulator is detachably connected to the metal dome. The elastic component may also be detached from the card tray. This can facilitate detachment and replacement of the insulator or the elastic component.

In an implementation, a limiting slot is formed between the insulator and the hearing plate, and the limiting slot is used for extension of an edge of the first card and/or an edge of the second card. In this way, an edge part of the first card and/or an edge part of the second card can be fastened.

In an implementation, a material of the insulator is elastic, and when the edge of the first card and/or the edge of the second card extend/extends into the limiting slot, the insulator elastically deforms, to fasten the edge of the first card and/or the edge of the second card. In this way, the insulator can be used to well fasten the edge of the first card and/or the edge of the second card, and abut against edge parts around and in the front of the first card and/or the second card, thereby preventing the first card and/or the second card from falling off.

In an implementation, a notch is disposed on the insulation frame, the notch and the elastic component are oppositely disposed on two opposite sides of the bearing plate, the insulation frame surrounds the bearing plate to form an accommodating area, and the notch is used to interconnect the accommodating area and external space of the card tray. A user may take out or place the first card and/or the second card through the notch, so as to improve user experience.

The present invention further provides a terminal device, including a circuit hoard and the card holder, where the card connector on the card holder is electrically connected to the circuit hoard.

Through implementation of the card connector and the card holder in the embodiments of the present invention, the first card and the second card are disposed in a cascading manner, are installed on the card tray, and are disposed in the terminal device. The cascaded first card and second card may greatly reduce internal space of the terminal device that is occupied by the card connector and the card holder, thereby facilitating lightening and thinning of the terminal device and improving an integration level of the terminal device. In addition, a memory card having a same size as an existing Nano SIM card may be further installed on the card connector provided in the embodiments of the present invention. In this way, even if a Nano SIM card and a memory card are installed, a plate area occupied by the card connector and the card holder does not increase due to this requirement. Therefore, more internal space in the terminal device to which the card connector and the card holder are applied can be saved for another component, or a mobile phone can be further lightened and thinned.

BRIEF DESCRIPTION OF DRAWINGS

To describe the technical solutions in the embodiments of the present invention or in the background more clearly, the following briefly describes the accompanying drawings required for describing the embodiments of the present invention or the background.

DESCRIPTION OF EMBODIMENTS

The following describes the embodiments of the present invention with reference to the accompanying drawings in the embodiments of this application.

Figure 1:
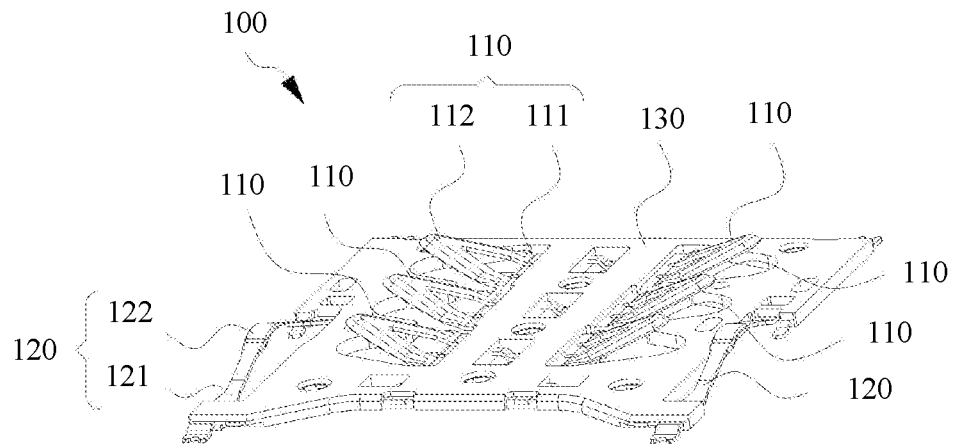
FIG. 1 is a schematic diagram of a three-dimensional structure of a card connector according to an embodiment of the present invention.
Figure 2:
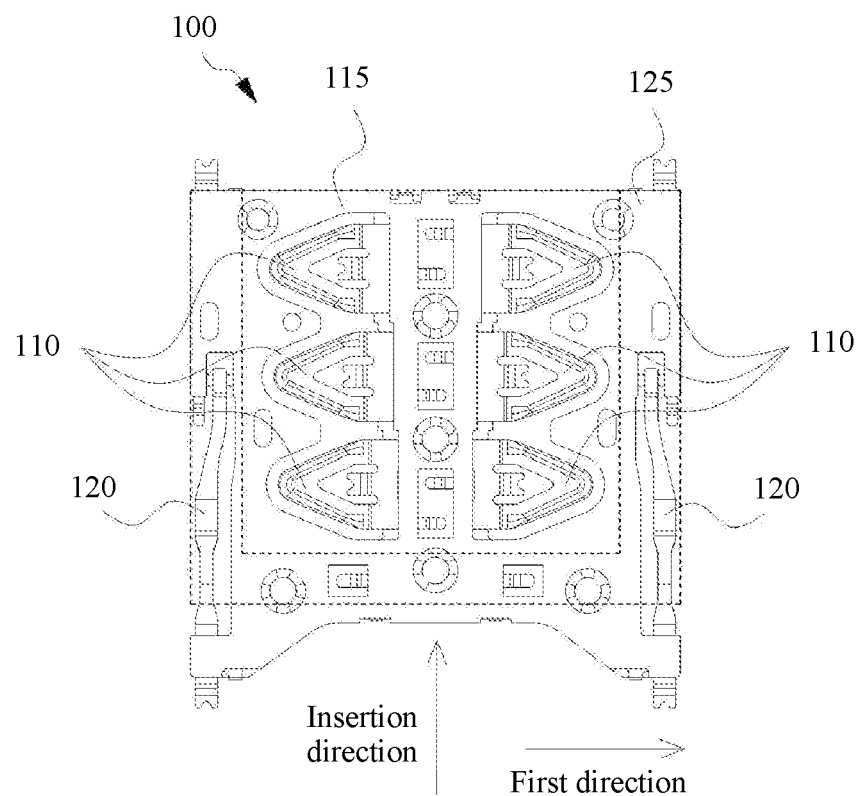
FIG. 2 is a schematic planar diagram of the card connector in FIG. 1.

FIG. 1 is a schematic diagram of a three-dimensional structure of a card connector according to an embodiment of the present invention, and FIG. 2 is a schematic planar diagram of the card connector in FIG. 1. The card connector 100 provided in this application may match two different types of electronic cards, and the electronic card may be a data card or a subscriber identity module card (SIM card), or may be a memory card. A Nano SIM card or an NM (nano memory) card having the same size as the Nano SIM may be placed on the card connector 100 that is provided in the embodiment and that is applicable to a terminal device. The NM card may be a customized memory card that is made by a manufacturer based on a size of the Nano SIM card and that can be accommodated in a Nano SIM card slot and a size of the NM card is approximate to or the same as that of the Nano SIM card. It should be understood that the terminal device may be a terminal device that needs to use the card connector and the Nano SIM card or the NM card, for example, a mobile phone or a tablet computer. For ease of understanding, the mobile phone that is more widely used is used as an example in this application to assist in understanding.

Figure 2A:
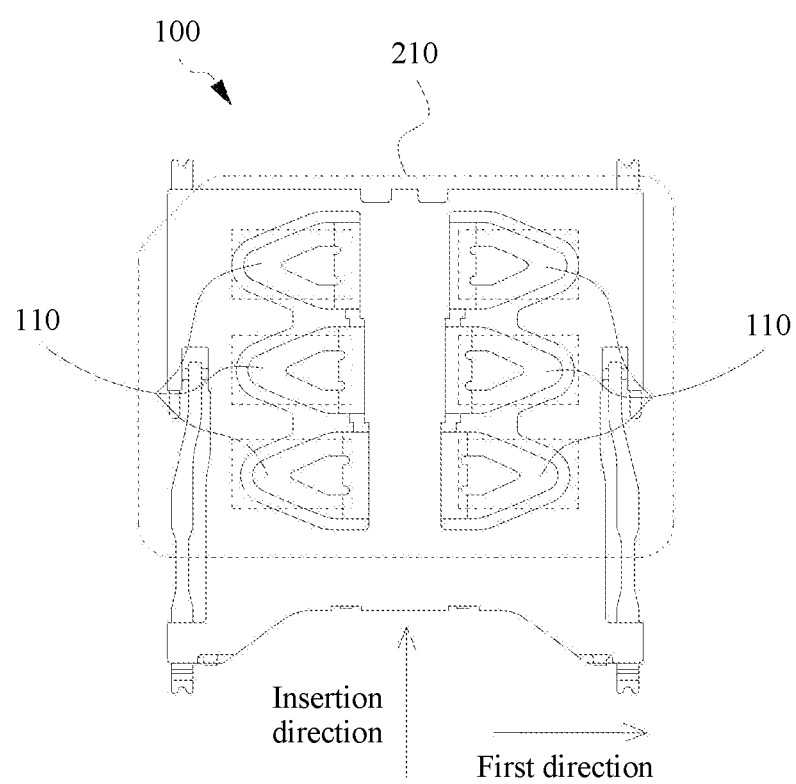
FIG. 2a is a schematic diagram of a first card access area of a card connector according to an embodiment of the present invention, where a dashed line represents a first card.
Figure 2B:
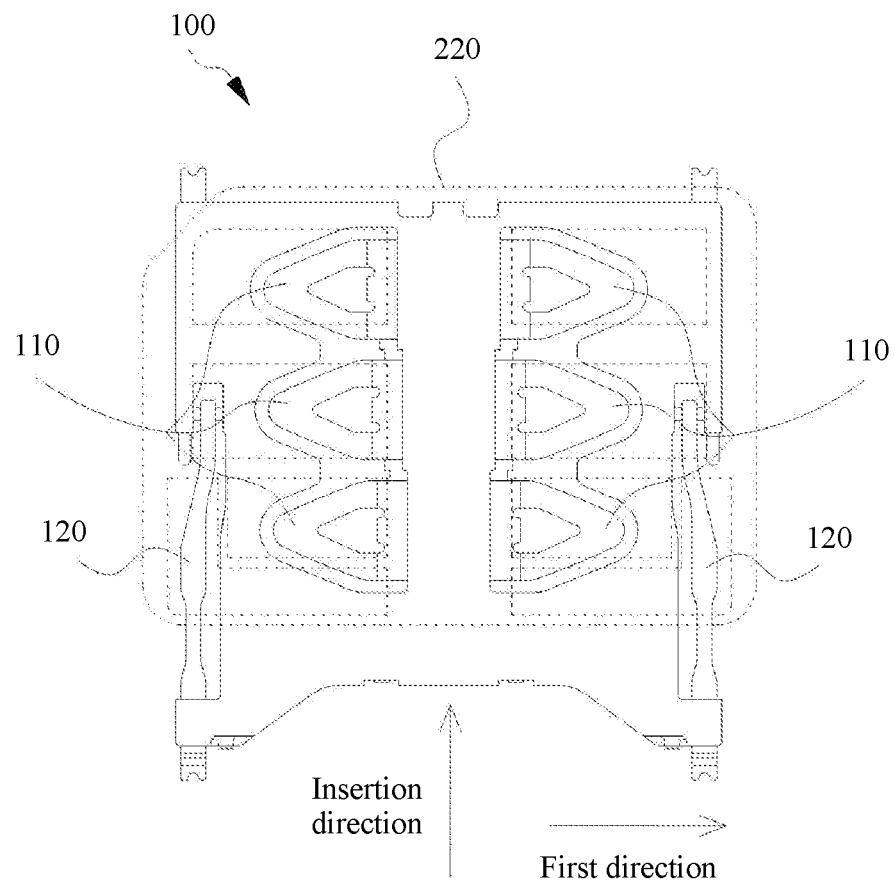
FIG. 2b is a schematic diagram of a second card access area of a card connector according to an embodiment of the present invention, where a dashed line represents a second card.

Referring to FIG. 1 to FIG. 2b, in an implementation, the card connector 100 includes a plurality of first terminals 110 and one or more second terminals 120. The plurality of first terminals 110 are arranged to form a first card access area 115, the first card access area 115 is used to install a first card, and the plurality of first terminals 110 are configured to be electrically connected to the first card. The one or more second terminals 120 are distributed on a periphery of the first card access area, the plurality of first terminals 110 and the one or more second terminals 120 jointly form a second card access area 125, the second card access area 125 is used to install a second card, and the first terminals 110 and the second terminals 120 are all configured to be electrically connected to the second card. An electrical connection relationship between the second card and the first terminals 110 and the second terminals 120 is a connection relationship having a data transmission function or a signal transmission function. When the second card is installed on the card connector 100, a circuit in the terminal device collects data (or a signal) of the second card by using the first terminals 110 and the second terminals 120, to further determine access of the second card. That the first terminals 110 are electrically connected to the first card also refers to a connection relationship having a data transmission function or a signal transmission function. When the first card is installed on the card connector 100, the circuit in the terminal device collects data (or a signal) of the first card by using the first terminals 110, to further determine access of the first card. When the first card is installed on the card connector 100, a chip pin of the first card may be physically in contact with the second terminals 120. However, in this case, the circuit in the terminal device cannot collect any data (or signal) by using the second terminals 120, and the second terminals 120 can only be configured to collect data (or a signal) of the second card.

In a specific implementation, there may be six first terminals 110, the first card may be a Nano SIM card, and the plurality of first terminals 110 respectively correspond to chip pins of the Nano SIM card. In another implementation, there may be more or less than six first terminals 110. A quantity of first terminals 110 is not limited in this application, and the quantity of first terminals 110 may be adjusted based on different types of cards. It may be understood that the second card access area 125 includes the first card access area 115. In a specific implementation, the second card may be an NM card, the NM card may include eight chip pins, there may be two second terminals 120, and the NM card is electrically connected to the six first terminals 110 and the two second terminals 120.

The card connector 100 can match both the Nano SIM card and the NM card by using the first terminals 110 and the second terminals 120. In other words, a same card connector 100 can match two different types of electronic cards, so that a function of the card connector 100 is extended. When the card connector is applied to the terminal device, space in the terminal device may be saved. A mobile phone is used as an example. The card connector 100 is applied to the mobile phone. Therefore, larger space may be saved for another component, so that the mobile phone can be further lightened and thinned.

In an implementation, the card connector 100 further includes an insulation body 130, the first terminals 110 or the second terminals 120 use a conductive material, and the plurality of first terminals 110 and the at least one second terminal 120 are disposed arid isolated by using the insulation body 130. Bach first terminal 110 includes a fixed end 111 and an elastic end 112. The fixed end III is fixedly connected to the insulation body 130. The fixed end 111 may be fastened to the insulation body 130 through a physical connection. For example, a clamping hole is disposed on the fixed end 111, a clamping post is disposed on the insulation body 130, and the fixed end is connected to the insulation body 130 through cooperation of the clamping post and the clamping hole. Alternatively, the fixed end 111 may be connected to the insulation body 130 through dual-material all-in-one injection molding. The elastic end 112 elastically protrudes relative to a surface of the insulation body 130, and is configured to abut against the first card or the second card. The elastic end 112 may be specifically configured to abut against a chip pin of the Nano SIM card or the NM card. As shown in FIG. 2, in a first direction, the fixed end 111 is located on a front side or a rear side of the elastic end 112, the one or more second terminals 120 are located on a front side and/or a rear side of the first card access area, and the first direction is perpendicular to an insertion direction of the first card or the second card (for details, refer to FIG. 2). In this implementation, the first card and the second card are horizontally inserted and electrically connected to the card connector, and the horizontal insertion means that the first card and the second card are approximately rectangular, and in a process of inserting the first card and the second card into the card connector, extension directions of short sides of the first card and the second card are consistent with the insertion direction, in an implementation, on the card connector 100, the fixed end 111 is approximately located in a middle part of the card connector 100, and the protruding elastic ends 112 are approximately located on two sides relative to the middle part. Based on the structure of the card connector 100, the elastic ends 112 of the plurality of first terminals 110 may correspond to chip pins of an existing Nano SIM card, or may correspond to chip pins of an NM card.

As shown in FIG 2, in an implementation, there may be two second terminals 120, and the two second terminals 120 are distributed on two sides of the first card access area 115, and can correspond to chip pins of the second card (NM card). Certainly, there may be one or more second terminals 120. A quantity of second terminals 120 may be changed based on types and chip pin designs of different cards.

As shown in FIG. 2a and FIG. 2b, in an implementation, to highlight location relationships of the first card 210 and the second card 220, some components of the card connector 100 are not shown. However, this is not limited. In FIG. 2a, a structure represented by dashed-line parts is a contour of the first card 210 and locations of pins of the first card 210. The first card 210 has six pins. It may be seen that in the embodiment shown in FIG. 2a, the first card 210 is horizontally inserted and cooperates with the card connector 100. Similarly, in FIG. 2b, a structure represented by dashed-line parts is a contour of the second card 220 and locations of pins of the second card 220. The second card 220 has eight pins. It may be seen that in the embodiment shown in FIG. 2a, the second card 220 is horizontally inserted and cooperates with the card connector 100.

In an implementation, each second terminal 120 includes a connection end 121 and an abutting end 122, the connection end 121 is fixedly connected to the insulation body 130, and the abutting end 122 elastically protrudes relative to the surface of the insulation body 130, and is configured to abut against the second card. Relative to the insulation body 130, an elastically protruding direction of the abutting end 122 of the second terminal 120 is the same as that of the elastic end 112 of the first terminal 110. As shown in FIG. 2, the first card access area 115 is approximately rectangular, and the two abutting ends 122 are respectively located on peripheries of two adjacent corners of the first card access area 115. The second terminal 120 extends in a long strip shape, and an extension direction of the second terminal 120 is approximately perpendicular to the first direction. In this way, the card connector corresponds to the size and the chip pins of the first card or the second card.

Figure 3:
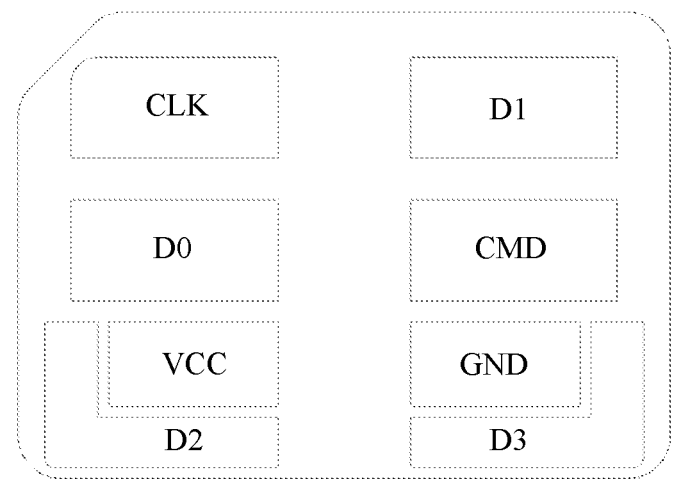
FIG. 3 is a schematic diagram of an NM card according to an embodiment of the present invention.

Referring to FIG. 3, in an implementation, the NM card has eight pins, including four data pins D0 to D4, a ground pin GND, a clock signal pin CLK, a command and response multiplexing pin CMD, and a power pin VCC. The eight pins are respectively electrically connected to the first terminals 110 and the second terminals 120 on the card connector 100.

Specifically, because each chip pin of the Nano SIM card or the NM card needs to occupy a specific area of a card surface, a layout of terminals that can be electrically connected to the pins of the Nano SIM card or the NM card is adapted on the card connector 100 based on locations of the pins. The size of the Nano SIM card is standardized. Based on this, pins other than two data pins D2 and D3 of the NM card correspond to the pins of the Nano SIM card. When (surface areas of) the chip pins on the NM card that correspond to the six chip pins of the Nano SIM card are made small, the data pins D2 and D3 may be disposed in any area on the NM card. FIG. 3 is only used as an example. Correspondingly, locations of the second terminals 120 of the card connector 100 are also adjusted based on locations of the data pins D2 and D3.

Further, the first card access area 115 is used to install the first card, and the second card access area 125 is used to install the second card access area. However, it should be understood that, the first card access area 115 is an area that abuts against the first card (Nano SIM card), and the second card access area 125 is an area that abuts against the second card (NM card). Actually, the Nano SIM card and the NM card have a same size, so that the card connector 100 has higher compatibility, and can be compatible with both the Nano SIM card and the NM card.

Figure 4:
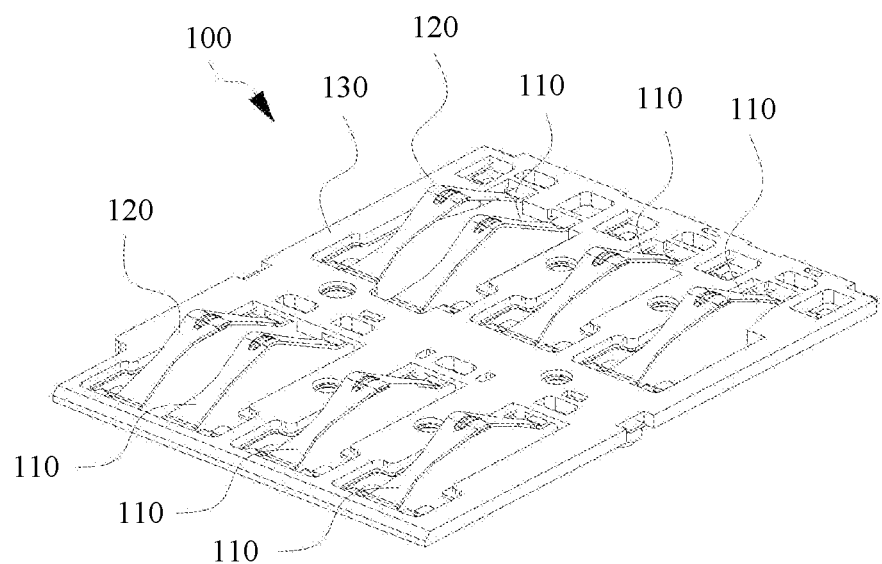
FIG. 4 is a schematic diagram of a three-dimensional structure of another card connector according to an embodiment of the present invention.
Figure 5:
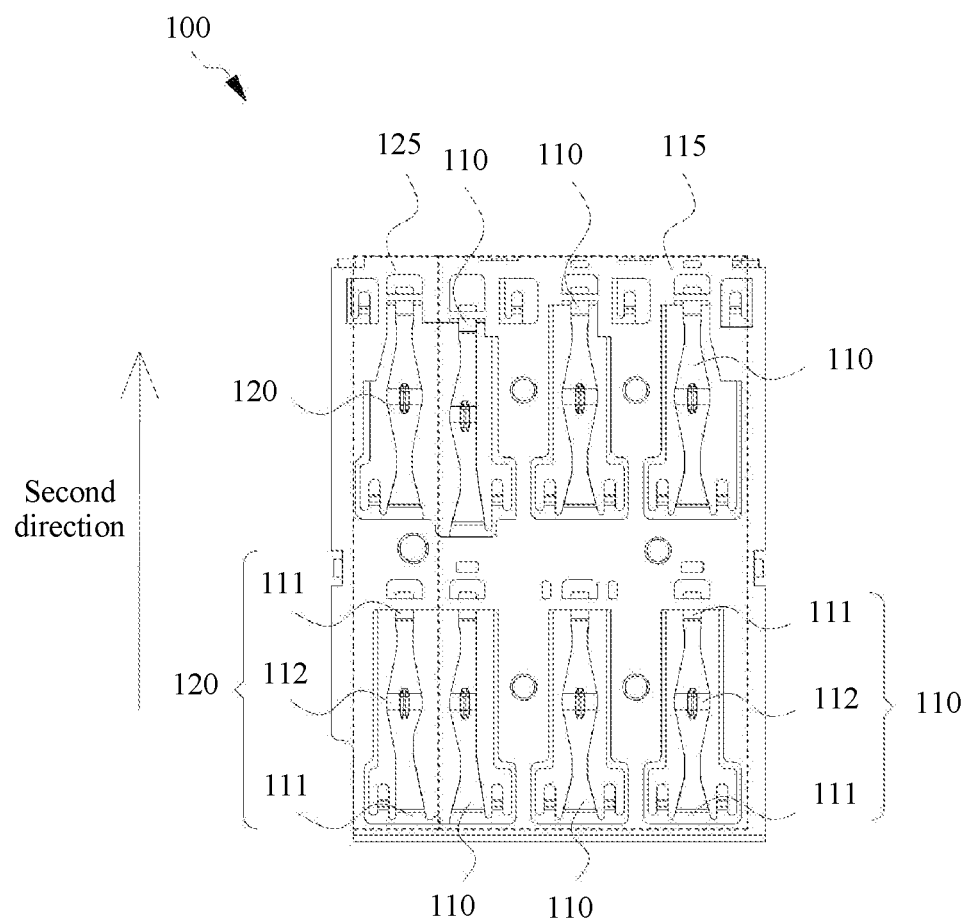
FIG. 5 is a schematic planar diagram of the card connector in FIG. 4.
Figure 5A:
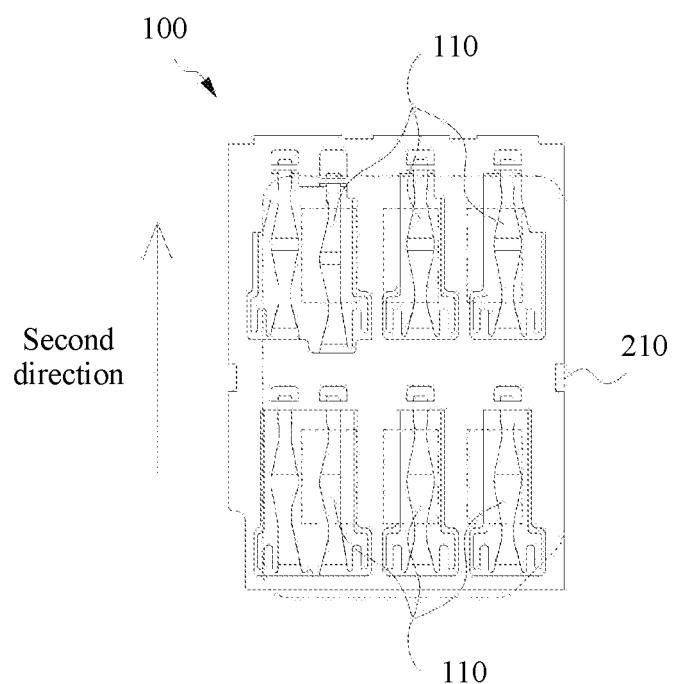
FIG. 5a is a schematic diagram of a first card access area of a card connector according to an embodiment of the present invention, where a dashed line represents a first card.
Figure 5B:
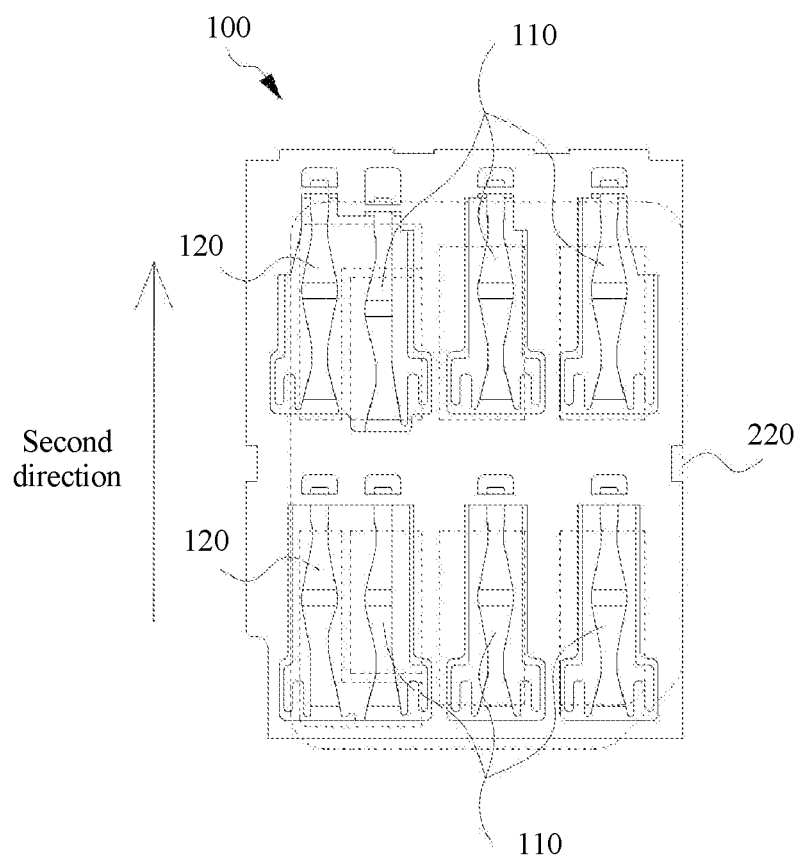
FIG. 5b is a schematic diagram of a second card access area of a card connector according to an embodiment of the present invention, where a dashed line represents a second card.
Figure 6:
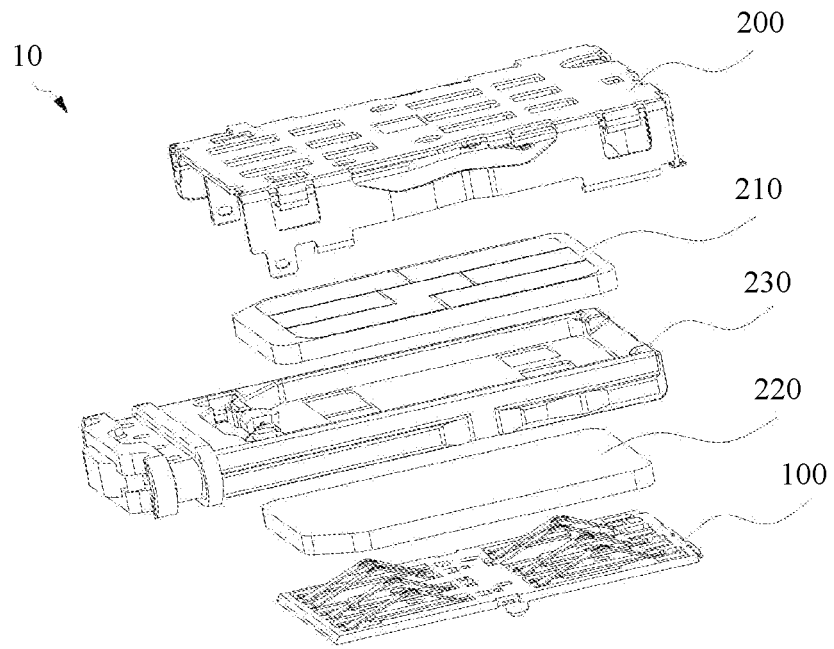
FIG. 6 and FIG. 7 are schematic structural diagrams of card holders according to an embodiment of the present invention.

Referring to FIG. 4 to FIG. 5b, in an implementation, the card connector 100 has another implementation status. The card connector 100 includes an insulation body 130, the first terminals 110 or the second terminals 120 use a conductive material, and the plurality of first terminals 110 and the at least one second terminal 120 are disposed and isolated by using the insulation body 130. Each of the first terminals 110 and the second terminals 120 includes fixed ends 111 and an elastic end 112, the fixed ends 111 are fixedly connected to the insulation body 130, the elastic end 112 is configured to abut against the first card or the second card, and the elastic end 112 may be specifically configured to abut against a chip pin of the Nano SIM card or the NM card. As shown in FIG 5, for each terminal, in a second direction, the fixed ends 111 are located on a front side and a rear side of the elastic end 112. The one or more second terminals 120 and the first card access area 115 are disposed side by side, and the second direction is an insertion direction of the first card or the second card.

In an implementation, for example, there are six first terminals 110, there are two second terminals 120, each first terminal 110 or second terminal 120 includes two fixed ends 111, and the two second terminals 120 are distributed on a same side of the first card access area 115, and are close to an edge of the card connector 100. In this way, the elastic end 112 of the second terminal 120 can abut against a corresponding chip pin of the second card after the second card (for example, an NM card) is installed.

In an implementation, as shown in FIG. 4, the plurality of first terminals 110 and the two second terminals 120 all extend in a long strip shape, and extension directions are all the second direction, so as to ensure that the first terminals 110 and the second terminals 120 have sufficient elasticity to abut against the first card or the second card, and can restore to a natural elastically-protruding state of the first terminals 110 and the second terminals 120 after the first card or the second card is removed.

Specifically, in this implementation, the first terminals 110 are arranged in a 2×3 array, in other words, the first terminals 110 are arranged in two rows and three columns, and the two second terminals 120 are respectively arranged on one side of the two rows of first terminals 110. In each row, a distance between a second terminal 120 and an adjacent first terminal 110 is shorter than a distance between two adjacent first terminals 110.

As shown in FIG. 5a and FIG. 5b, in an implementation, to highlight location relationships of the first card 210 and the second card 220, some components of the card connector 100 are not shown. However, this is not limited. In FIG. 5a, a structure represented by dashed-line parts is a contour of the first card 210 and locations of pins of the first card 210. The first card 210 has six pins. It may be seen that in the embodiment shown in FIG. 2a, the first card 210 is vertically inserted and cooperates with the card connector 100. Similarly, in FIG. 2b, a structure represented by dashed-line parts is a contour of the second card 220 and locations of pins of the second card 220. The second card 220 has eight pins. It may be seen that in the embodiment shown in FIG. 2a, the second card 220 is vertically inserted and cooperates with the card connector 100.

It should be understood that the first direction and the second direction in the embodiments are directions defined for assisting in understanding the structure of the card connector 100. As shown in FIG. 2a and FIG. 2b, the first direction is an extension direction of a longer side of the first card or the second card, a direction in which the first card or the second card is inserted into the card connector is perpendicular to (or approximately perpendicular to) the first direction, and this is horizontal card insertion. As shown in FIG. 5a and FIG. 5b, the second direction is an extension direction of a longer side of the first card or the second card, an insertion direction is the same as the second direction, and this is vertical card insertion.

Figure 7:
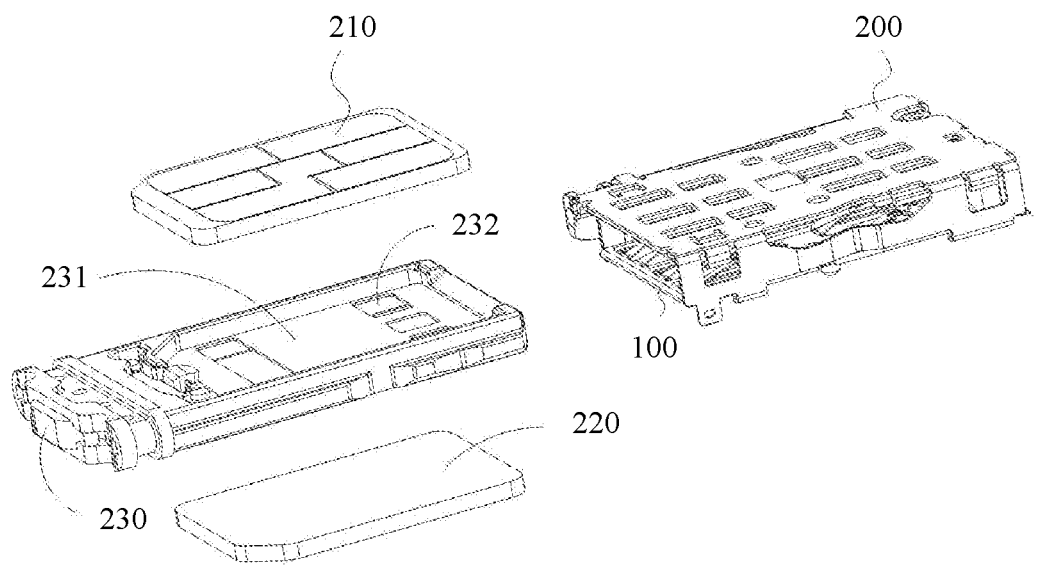
Figure 8:
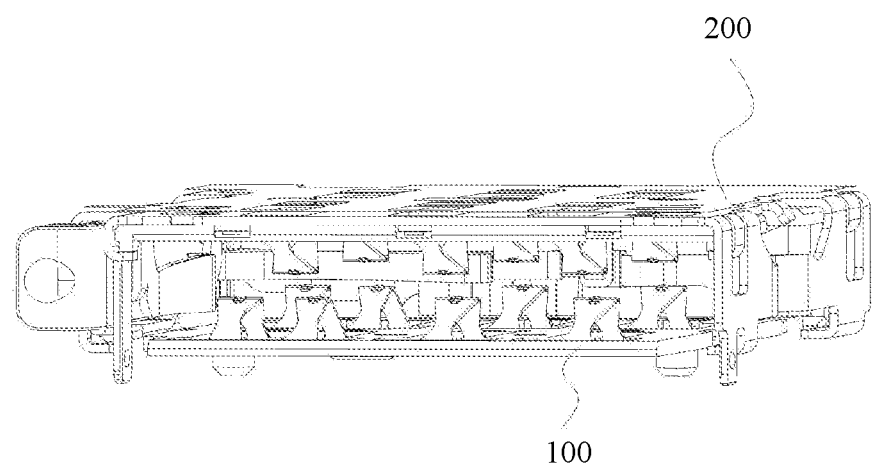
FIG. 8 is a schematic diagram of an internal structure of a card holder according to an embodiment of the present invention.

Referring to FIG. 6 to FIG. 10, an embodiment provides a card holder 10, including a housing 200 and the card connector 100 in the foregoing embodiments. The housing 200 is designed in an enclosed manner to form accommodating space, and the card connector 100 is fastened in the accommodating space. The first card 210 or the second card 220 can be disposed in the accommodating space, and are electrically connected to the card connector 100 on the card holder 10. In the embodiment shown in FIG. 6, only one card connector 100 may be disposed in the housing 200, or two card connectors 100 may be disposed in a cascading manner. When only one card connector 100 is disposed in the housing 200, the card holder 10 may still accommodate two cards at the same time. The two cards are placed on two opposite sides of a card tray in a cascading manner. One card is used in cooperation with the card connector 100, and the other card is accommodated in the card holder and is in a state in which the card is to be used through replacement. For example, when the other card needs to be used, locations of the two cards may be exchanged. When two cascaded card connectors 100 are disposed in the housing, as shown in FIG. 8, terminals of the two card connectors are oppositely disposed, and chip pins of the two cards are respectively oriented toward the terminals of the card connectors, so as to be electrically connected to the terminals of the card connectors. In this way, the two cards may be used at the same time. This is further described in the following embodiments.

As shown in FIG. 7 and FIG. 8, in an implementation, for example, there are two card connectors 100, the two card connectors 100 are oppositely disposed, a slot is formed between the two card connectors 100, and the first terminals 110 and the second terminals 120 of the two card connectors 100 all elastically protrude toward the slot, to be electrically connected to the inserted first card 210 and/or the inserted second card 220. In addition, because the two card connectors 100 are located on different sides of the slot, the inserted first card 210 and/or the inserted second card 220 do not interfere with each other, so that the first card 210 and/or the second card 220 can operate separately without interfering with each other. Further, because the first card 210 and the second card 220 are disposed in a cascading manner, an area occupied by the card holder 10 is reduced to a relatively great extent, and the occupied area is approximately slightly larger than a surface area of one Nano SIM card (not larger than a surface area of two Nano SIM cards). A thickness of the card holder 10 is slightly increased, and the thickness is slightly greater than a thickness of two Nano SIM cards. Space saved by reducing the occupied area is far larger than space reduced by increasing the thickness. Overall, space required for disposing the two cards may be reduced, and an integration level of the terminal device is improved, so that more space is saved. Therefore, the terminal device can implement more functions or better user experience.

As shown in FIG. 7, in an implementation, the first card 210 and the second card 220 can be installed in the slot at the same time, and are electrically connected to the two card connectors 100 in a one-to-one correspondence. For example, the chip pins of the first card 210 and the second card 220 are oppositely disposed.

Figure 9A:
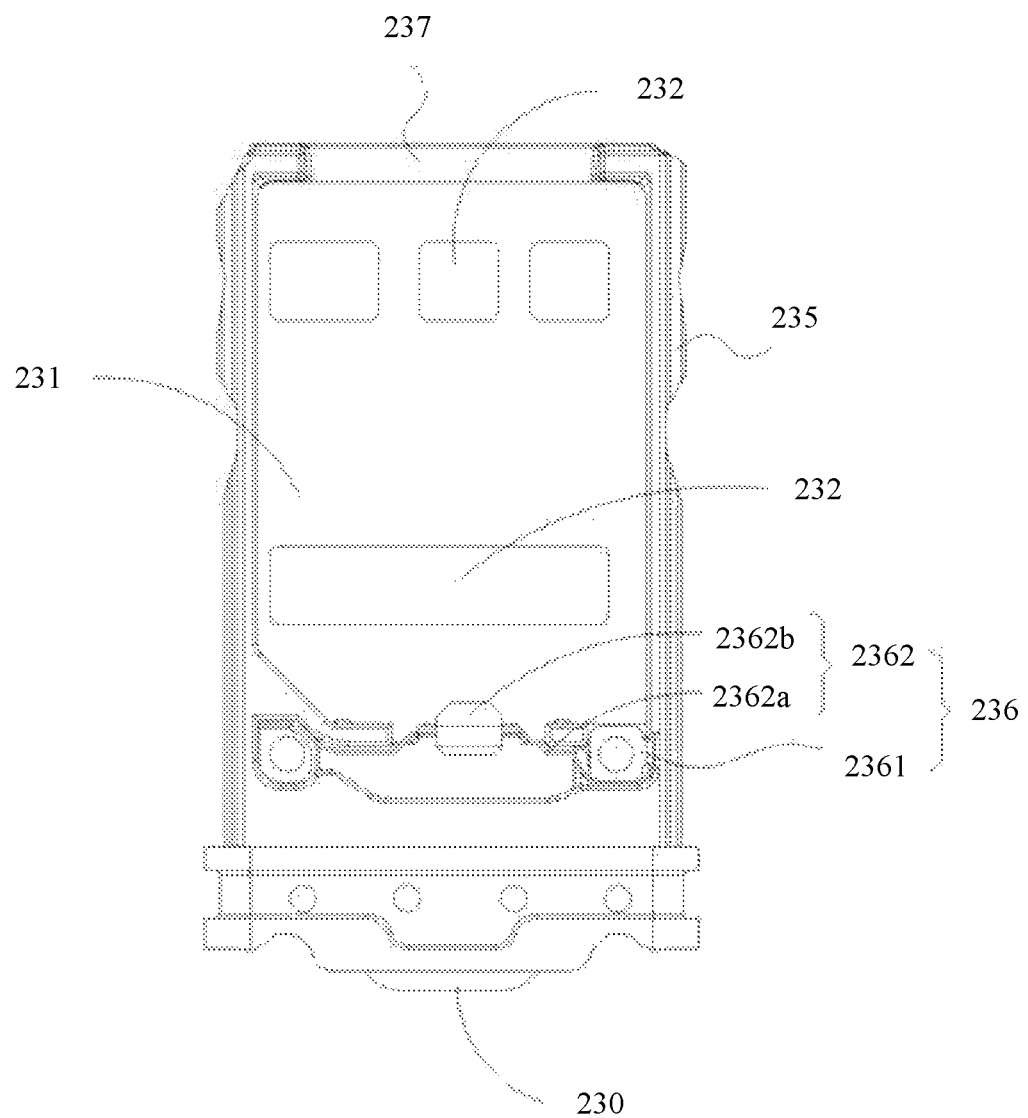
FIG. 9a is a schematic structural diagram of a card tray according to an embodiment of the present invention.
Figure 9B:
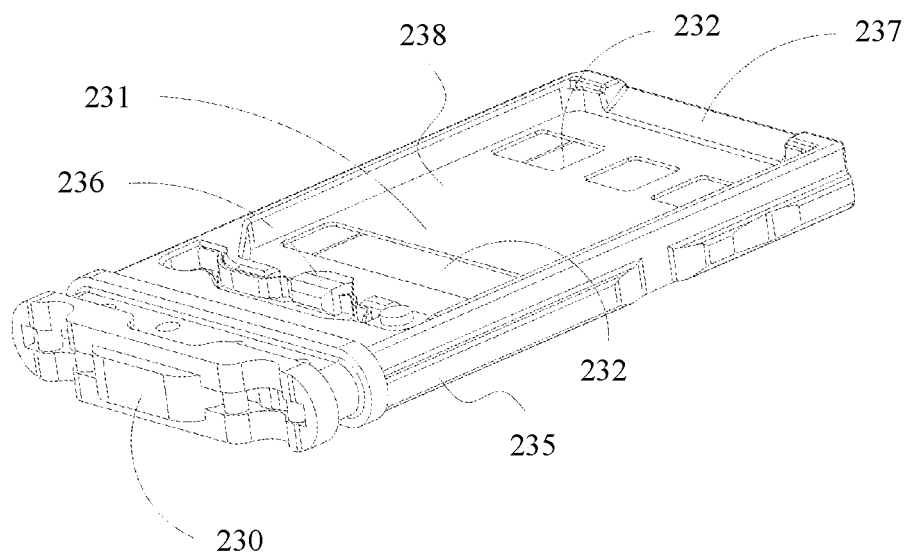
FIG. 9b is a schematic three-dimensional diagram of a card tray according to an embodiment of the present invention.

In an implementation, the card holder 10 further includes a card tray 230. As shown in FIG. 9a and FIG. 9b, the card tray 230 may be installed in the slot, the card tray 230 includes a bearing plate 231, both a front surface and a rear surface of the hearing plate 231 are used to bear the first card 210 and/or the second card 220, and the bearing plate 231 is disposed between the two card connectors 100.

In art implementation, to ensure that the card tray 230 hearing the first card 210 and/or the second card 220 is inserted into the card holder 10, the bearing plate 231 needs to be sufficiently rigid, and is not easy to crack or deform. For example, a material of the hearing plate 231 may be metal.

As shown in FIG. 9a to FIG. 9d, and FIG. 10, because the bearing plate 231 is a piece of metal that has relatively high rigidity and is not easy to deform, and the bearing plate 231 uses a conductive material, to prevent a fault such as a short circuit caused because the first terminals 110 or the second terminals 120 on the card connector 100 elastically protrude and are in contact with the bearing plate 231, gaps 232 relative to the first terminals 110/the second terminals 120 are disposed on the bearing plate 231, and the gaps 232 are used to avoid the first terminals 110 and the second terminals 120. As shown in FIG. 9b, for example, the gaps 232 can avoid the first terminals 110 and the second terminals 120.

As shown in FIG. 7, FIG. 9a, and FIG. 9b, in an implementation, a card (a Nano SIM card or an NM card) may be installed on each of two surfaces (namely, two surfaces of the bearing plate) of the card tray 230, and the two cards are installed in a cascading form. Each surface of the card tray 230 includes an insulation frame 235 and an elastic component 236 that surround (which may be full surrounding, half surrounding, or partial surrounding) the hearing plate, the elastic component 236 includes a fixed part 2361 and an elastic part 2362, the fixed part 2361 is fastened to the card tray 230, the elastic part 2362 extends to the bearing plate 231, and the elastic part 2362 includes a metal dome 2362a and an insulator 2362b that is connected to the metal dome 2362a and that is configured to abut against the first card 210 and/or the second card 220. Specifically, the fixed part 2361 may be fastened to the insulation frame 235. In another implementation, the bearing plate 231 may include an edge part. The edge part of the bearing plate 231 is inserted into the insulation frame 235, so that the bearing plate 231 is connected to the insulation frame 235. It may be understood that the insulation frame 235 surrounds the bearing plate 231 through injection molding and covers the edge part of the bearing plate 231, so that the fixed part 2361 can be fastened to the edge part of the bearing plate 231. The bearing plate 231 uses a metal material and the fixed part 2361 may also use a metal material. In this way, through contact of the fixed part 2361 and the edge part of the bearing plate 231, the bearing plate 231 can be better grounded, so that electrostatic interference can be prevented.

Because the first card 210 and the second card 220 are disposed in a cascading manner, at least one of the two cards (210 and 220) is easy to break away from the card tray 230 due to a direction problem when the two cards are being inserted. The first card 210 and/or the second card 220 are/is clamped through cooperation of the elastic component 236 and the insulation frame 235, so that the first card 210 and the second card 220 can be well fastened to the card tray 230. Even if the card tray 230 is rotated in any direction, the first card 210 or the second card 220 is not easy to fall off, so that it is convenient for a user to install the first card 210 and/or the second card 220.

In an implementation, the insulator 2362b may be connected to the metal dome 2362a in a detachable form. In this structure, when the insulator 2362b may wear the NM card or the Nano SIM card due to long term use, the old insulator 2362b may be replaced with a new insulator 2362b. In addition, when the terminal device is recycled, it may be convenient for a recycler to quickly detach the insulator 2362b, so as to improve utilization of a component of the terminal device and reduce detachment costs.

In an implementation, the elastic component 236 may be fastened to the card tray 230 in a detachable form. In this structure, when elasticity of the elastic part weakens due to long term use, the old elastic component may be replaced with a new elastic component. In addition, when the terminal device is recycled, it may be convenient for a recycler to quickly detach the elastic component, so as to improve utilization of a component of the terminal device and reduce detachment costs.

Figure 9C:
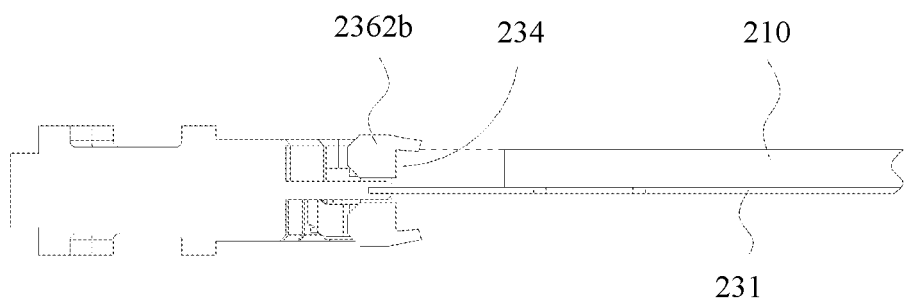
FIG. 9c and FIG. 9d are sectional views of a card tray according to an embodiment of the present invention.
Figure 9D:
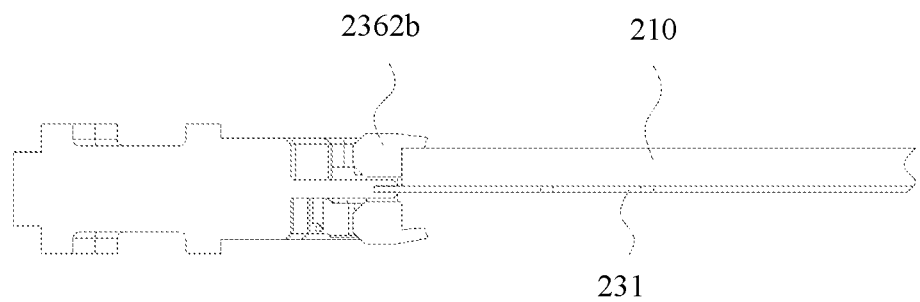

As shown in FIG. 9c and FIG. 9d, in an implementation, a limiting slot 234 is formed between the insulator 2362b and the bearing plate 231, an edge of the first card 210 and/or an edge of the second card 220 extend/extends into the limiting slot 234, and an edge part of the first card 210 and/or an edge part of the second card 220 are/is fastened to an edge of the limiting slot 234.

Figure 9E:
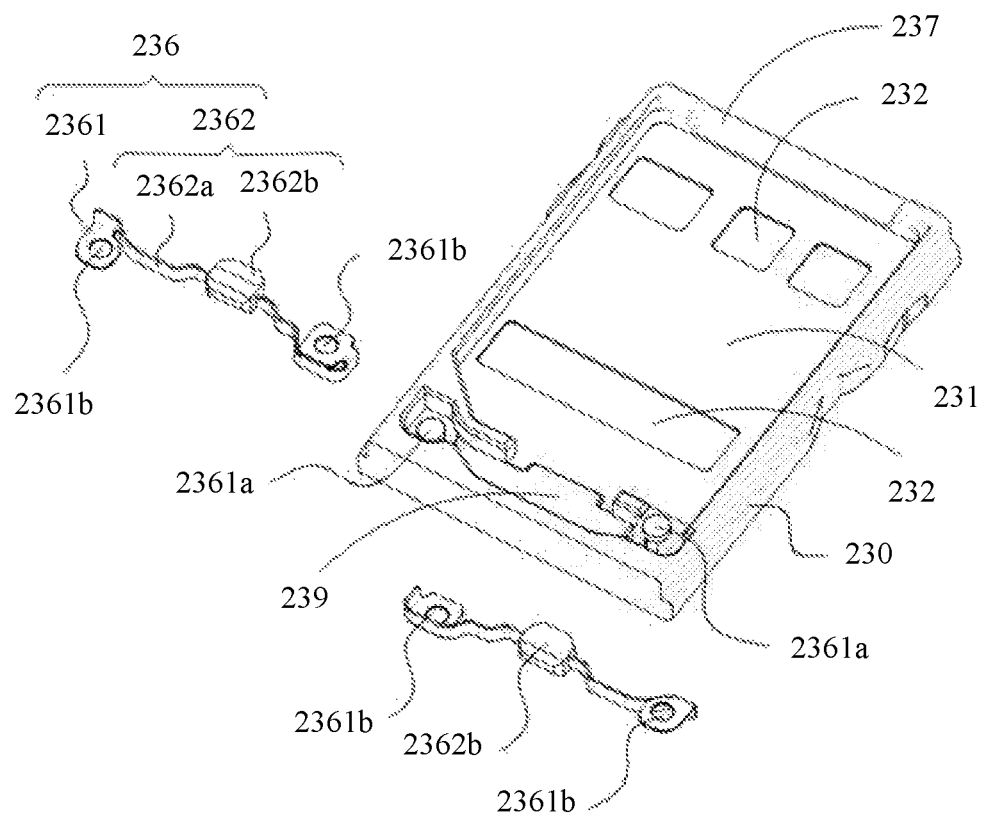
FIG. 9e is an analytical diagram of a card tray according to an embodiment of the present invention.
Figure 10:
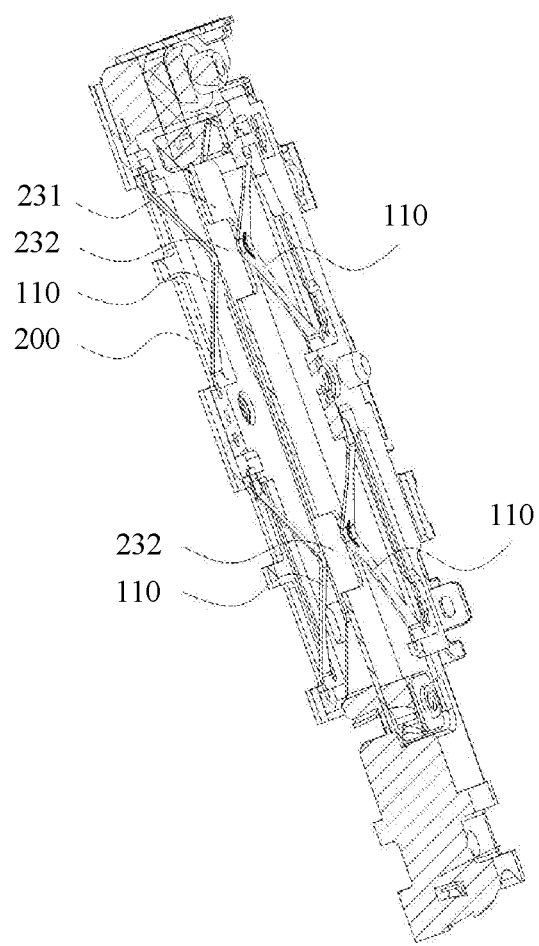
FIG. 10 is a cross section chart of a card holder according to an embodiment of the present invention.

In an implementation, a groove 239 is disposed on the card tray 230, and the elastic component 236 is accommodated in the groove 239. It may be understood that the card tray 230 has an insertion end, namely, an end that is first inserted into the slot. The groove 239 may be disposed at the opposite end of the insertion end of the card tray. A fastening hole 2361b is disposed on the fixed part 2361 of the elastic component 236, and the fixed part 2361 is fastened to the card tray 230 through cooperation of a fastening post 2361a and the fastening hole 2361b. The fastening post 2361a may be considered as a part of the fixed part 2361, or may be considered as an independent component (for example, a fastener such as a screw) independent of the fixed part 2361 and a body of the card tray 230. Alternatively, the fastening post 2361a may be considered as a part of a body of the card tray 230, and may be molded together with the card tray 230. FIG. 9e is used as an example. For example, there are two fastening holes 2361b on each elastic component 236, two fastening posts 2361a are designed and correspond to the fastening holes 2361b, and there are two elastic components 236, configured to respectively abut against the first card and/or the second card located on two sides of the bearing plate 231. The fastening post 2361a penetrates through the fastening hole 2361b, to fasten the elastic component 236 to the card tray 230. In this way, when the elastic part 2362 abuts against the first card and/or the second card, the fixed part 2361 can provide strong support for the elastic part 2362. It may be understood that holes are disposed at locations corresponding to the fastening posts 2361a on the card tray 230, and the fastening posts 2361a penetrate through the holes to fasten the elastic components 236 on the two sides of the card tray.

In an implementation, a material of the insulator 2362b is elastic. When the edge of the first card 210 and/or the edge of the second card 220 extend/extends into the limiting slot 234, the insulator 2362b elastically deforms, to fasten the edge of the first card 210 and/or the edge of the second card 220. A height of the limiting slot 234 is slightly less than a height of the first card 210 and/or a height of the second card 220. As shown in FIG. 9c, the first card 210 is used as an example, and the height of the limiting slot 234 is slightly less than the height of the first card 210. However, the insulator 2362b may elastically deform to enable the first card 210 to be embedded in the limiting slot 234. In this way, as shown in FIG. 9d, the insulator 2362b can be used to well fasten the edge of the first card 210, and abut against edge parts around and in the front of the first card 210, so that the first card 210 can be prevented from falling off, thereby improving stability of an electrical connection between the first card 210 and the card connector 100.

In an implementation, a notch 237 is disposed on the insulation frame 235, the notch 237 and the elastic component 236 are oppositely disposed on two opposite sides of the bearing plate 231, the insulation frame 235 surrounds the bearing plate 231 to form an accommodating area 238, and the notch 237 is used to interconnect the accommodating area 238 and external space of the card tray 230. Optionally, the notch 237 is disposed on the insertion end of the card tray 230. The user may take out or place the first card 210 and/or the second card 220 through the notch 237, so as to improve user experience.

Figure 11:
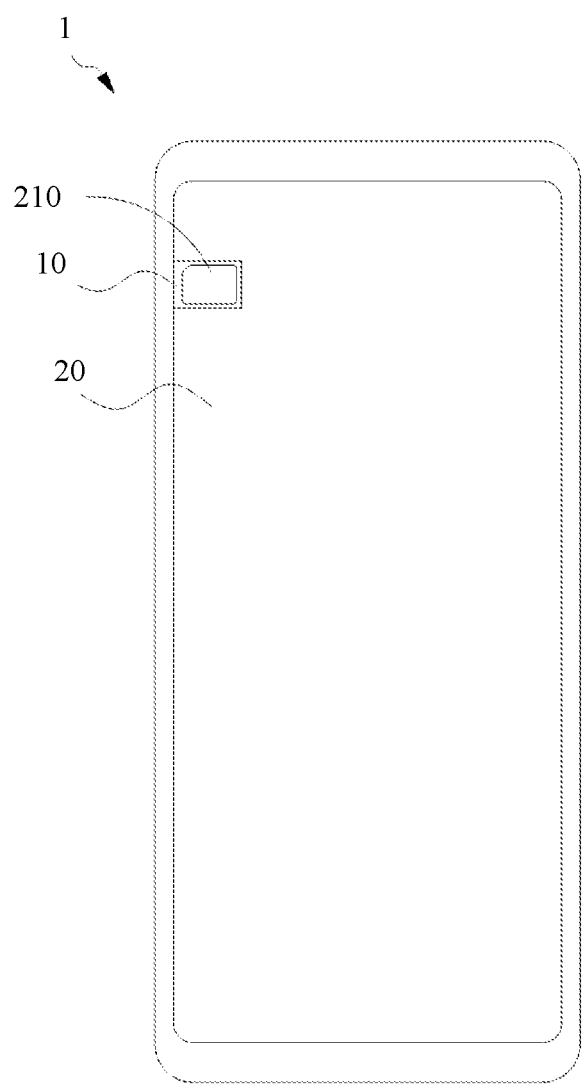
FIG. 11 is a schematic diagram of a terminal device according to an embodiment of the present invention.

Referring to FIG. 11, an embodiment further provides a terminal device 1. The terminal device 1 includes a circuit board 20 and the card holder 10 in the foregoing embodiments. The card connector 100 on the card holder 10 is electrically connected to the circuit board, so as to drive the first card 210 and/or the second card 220 installed in the card holder 10. The first card 210 is shown in the figure. It should be understood that a cascading relationship between the card holder 10 and the circuit board 20 is shown in the figure for only understanding, and is not intended to limit layers of the card holder 10 and the circuit board 20.

The foregoing descriptions are merely preferred implementations of this application, it should be noted that a person of ordinary skill in the art may make several improvements or polishing without departing from the principle of this application and the improvements or polishing shall fall within the protection scope of this application.

What is claimed is:

1. A card connector comprising:
   a plurality of first terminals arranged to form a first card access area that is configured to install a first card, wherein the first terminals are configured to be electrically coupled to the first card;
   one or more second terminals distributed on a periphery of the first card access area, wherein each of the one or more second terminals comprises a connection end, wherein the first terminals and the one or more second terminals form a second card access area that is configured to install a second card, and wherein the first terminals and the one or more second terminals are configured to be electrically coupled to the second card; and
   an insulation body, wherein each of the first terminals comprises:
      a fixed end coupled to the insulation body; and
      an elastic end protruding relative to a surface of the insulation body and configured to abut against the first card or the second card,
      wherein the fixed end is located on a front side of the elastic end or a rear side of the elastic end in a first direction,
      wherein the one or more second terminals are located on a front side of the first card access area or a rear side of the first card access area in the first direction, and
      wherein the first direction is perpendicular to an insertion direction of the first card or the second card.

2. The card connector of claim 1, wherein the one or more second terminals comprise two second terminals distributed on two sides of the first card access area.

3. The card connector of claim 2, wherein the connection end is coupled to the insulation body, wherein each of the one or more second terminals further comprises an abutting end elastically protruding relative to the surface of the insulation body and configured to abut against the second card, wherein the first card access area is a rectangular shape, and wherein two abutting ends are located on peripheries of two adjacent corners of the first card access area.

4. The card connector of claim 1, wherein the fixed end is located on a front side or a rear side of the elastic end in a second direction, wherein the second direction is the insertion direction of the first card or the second card, and wherein the one or more second terminals and the first card access area are disposed side by side in the second direction.

5. The card connector of claim 4, wherein the one or more second terminals comprise two second terminals distributed on a same side of the first card access area.

6. A card holder comprising:
a housing disposed with an accommodating space; and
at least one card connector fastened in the accommodating space and comprising:
an insulation body;
a plurality of first terminals coupled to the insulation body and arranged to form a first card access area that is configured to install a first card, wherein the first terminals are configured to be electrically coupled to the first card; and
one or more second terminals distributed on a periphery of the first card access area, wherein each of the one or more second terminals comprises a connection end,
wherein the first terminals and the one or more second terminals form a second card access area that is configured to install a second card,
wherein the first terminals and the one or more second terminals are configured to be electrically coupled to the second card,
wherein the at least one card connector comprises two card connectors that are oppositely disposed and that form a slot between the two card connectors, wherein first terminals and second terminals of the two card connectors elastically protrude toward the slot, and wherein the first card and the second card are simultaneously installed in the slot and are electrically coupled to the two card connectors in a one-to-one correspondence.

7. The card holder of claim 6, further comprising a card tray, wherein the card tray comprises a bearing plate disposed between the two card connectors in a cascading manner when the card tray is inserted into the slot, and wherein the bearing plate comprises:
a front surface configured to bear the first card or the second card; and
a rear surface configured to bear the first card or the second card,
wherein the card holder further comprises gaps disposed on the bearing plate and configured to avoid the first terminals and the second terminals.

8. The card holder of claim 7, wherein the bearing plate is made of a metal material.

9. The card holder of claim 7, wherein the card tray further comprises:
an insulation frame; and
an elastic component that surrounds the bearing plate, wherein the elastic component comprises:
a fixed part fastened to the card tray; and
an elastic part extending to the bearing plate and comprising:
a metal dome; and
an insulator coupled to the metal dome and configured to abut against the first card or the second card.

10. The card holder of claim 9, wherein the insulator is detachably coupled to the metal dome.

11. The card holder of claim 9, wherein the insulator and the bearing plate form a limiting slot, and wherein the limiting slot extends an edge of the first card or an edge of the second card.

12. The card holder of claim 11, wherein a material of the insulator is elastic, and wherein the insulator is configured to deform to fasten the edge of the first card or the edge of the second card.

13. The card holder of claim 9, further comprising a notch disposed on the insulation frame, wherein the notch and the elastic component are oppositely disposed on two opposite sides of the bearing plate, wherein the insulation frame surrounds the bearing plate to form an accommodating area, and wherein the notch is configured to interconnect the accommodating area and an external space of the card tray.

14. A terminal device comprising:
a circuit board; and
a card holder comprising:
a housing disposed with an accommodating space; and
at least one card connector fastened in the accommodating space and comprising:
a plurality of first terminals arranged to form a first card access area that installs a first card, wherein the first terminals are configured to be electrically coupled to the first card; and
one or more second terminals distributed on a periphery of the first card access area, wherein each of the one or more second terminals comprises a connection end,
wherein the first terminals and the one or more second terminals form a second card access area that installs a second card,
wherein the first terminals and the one or more second terminals are configured to be electrically coupled to the second card, wherein the card connector is electrically coupled to the circuit board,
wherein the at least one card connector comprises two card connectors that are oppositely disposed and that form a slot between the two card connectors, wherein first terminals and second terminals of the two card connectors elastically protrude toward the slot, and wherein the first card and the second card are simultaneously installed in the slot and are electrically coupled to the two card connectors in a one-to-one correspondence.

15. The terminal device of claim 14, wherein the card holder further comprises a card tray, wherein the card tray comprises a bearing plate disposed between the two card connectors in a cascading manner when the card tray is inserted into the slot, and wherein the bearing plate comprises:
a front surface configured to bear the first card or the second card; and
a rear surface configured to bear the first card or the second card,
wherein the card holder further comprises gaps disposed on the bearing plate and configured to avoid the first terminals and the second terminals.

16. The terminal device of claim 15, wherein the bearing plate is made of a metal material.

17. The terminal device of claim 15, wherein the card tray further comprises:
- an insulation frame; and
- an elastic component that surrounds the bearing plate, wherein the elastic component comprises:
  - a fixed part fastened to the card tray; and
  - an elastic part extending to the bearing plate and comprising:
    - a metal dome; and
    - an insulator coupled to the metal dome and configured to abut against the first card or the second card.

18. The terminal device of claim 17, wherein the insulator is detachably coupled to the metal dome.

19. The terminal device of claim 17, wherein the insulator and the bearing plate form a limiting slot, and wherein the limiting slot extends an edge of the first card or an edge of the second card.

20. The terminal device of claim 19, wherein a material of the insulator is elastic, and wherein the insulator is configured to deform to fasten the edge of the first card or the edge of the second card.

\* \* \* \* \*